United States Patent
Wu et al.

(10) Patent No.: US 12,414,237 B2
(45) Date of Patent: Sep. 9, 2025

(54) ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 239 days.

(21) Appl. No.: 18/136,303

(22) Filed: Apr. 18, 2023

(65) Prior Publication Data

US 2023/0389186 A1 Nov. 30, 2023

(30) Foreign Application Priority Data

May 25, 2022 (CN) .......................... 202210578600.0

(51) Int. Cl.
*H05K 1/18* (2006.01)

(52) U.S. Cl.
CPC ... *H05K 1/189* (2013.01); *H05K 2201/09827* (2013.01); *H05K 2201/10128* (2013.01); *H05K 2201/10287* (2013.01)

(58) Field of Classification Search
CPC ......... H05K 1/189; H05K 2201/09827; H05K 2201/10128; H05K 2201/10287

USPC ............................................. 361/679.01, 749
See application file for complete search history.

(56) References Cited

U.S. PATENT DOCUMENTS

| | | | |
|---|---|---|---|
| 2017/0040306 A1* | 2/2017 | Kim | .................. H01L 23/49894 |
| 2020/0350506 A1* | 11/2020 | Cho | .................. H10K 59/8731 |
| 2021/0192983 A1 | 6/2021 | Sui | |
| 2023/0105157 A1* | 4/2023 | Jiang | .................... H10K 77/111 257/40 |

FOREIGN PATENT DOCUMENTS

| | | |
|---|---|---|
| CN | 104769719 B | 11/2018 |
| TW | 201334125 A1 | 8/2013 |
| TW | 202114471 A | 4/2021 |
| TW | 202129898 A | 8/2021 |
| TW | 202316698 A | 4/2023 |

* cited by examiner

*Primary Examiner* — Binh B Tran
(74) *Attorney, Agent, or Firm* — Winston Hsu

(57) ABSTRACT

An electronic device is provided by the present disclosure. The electronic device includes a first main structure, a second main structure adjacent to the first main structure, a connecting structure connecting the first main structure and the second main structure, a first semiconductor disposed on the first main structure and a first insulating structure disposed between the first semiconductor and the first main structure, wherein the first insulating structure has a first groove.

13 Claims, 11 Drawing Sheets

ELECTRONIC DEVICE

BACKGROUND OF THE DISCLOSURE

1. Field of the Disclosure

The present disclosure relates to an electronic device, and more particularly relates to a stretchable electronic device.

2. Description of the Prior Art

The stretchable electronic devices can be attached to any suitable curved surface to increase the applications thereof. For example, the stretchable electronic device can be attached to automotive displays and serve as vehicle displays or vehicle sensors, or be attached to human's skin and serve as wearing displays or wearing sensors. However, the substrate of the stretchable electronic device may be cracked or damaged when the stretchable electronic device is deformed, thereby affecting lifespan of the stretchable electronic device. Therefore, to improve the design of the stretchable electronic device to reduce cracking or damage of the stretchable electronic device is still an important issue in the related field.

SUMMARY OF THE DISCLOSURE

In order to solve the above-mentioned problems, the purpose of the present disclosure is to provide an electronic device.

In some embodiments, an electronic device is provided by the present disclosure. The electronic device includes a first main structure, a second main structure adjacent to the first main structure, a connecting structure connecting the first main structure and the second main structure, a first semiconductor disposed on the first main structure and a first insulating structure disposed between the first semiconductor and the first main structure, wherein the first insulating structure has a first groove.

These and other objectives of the present disclosure will no doubt become obvious to those of ordinary skill in the art after reading the following detailed description of the embodiment that is illustrated in the various figures and drawings.

DETAILED DESCRIPTION

Figure 1:
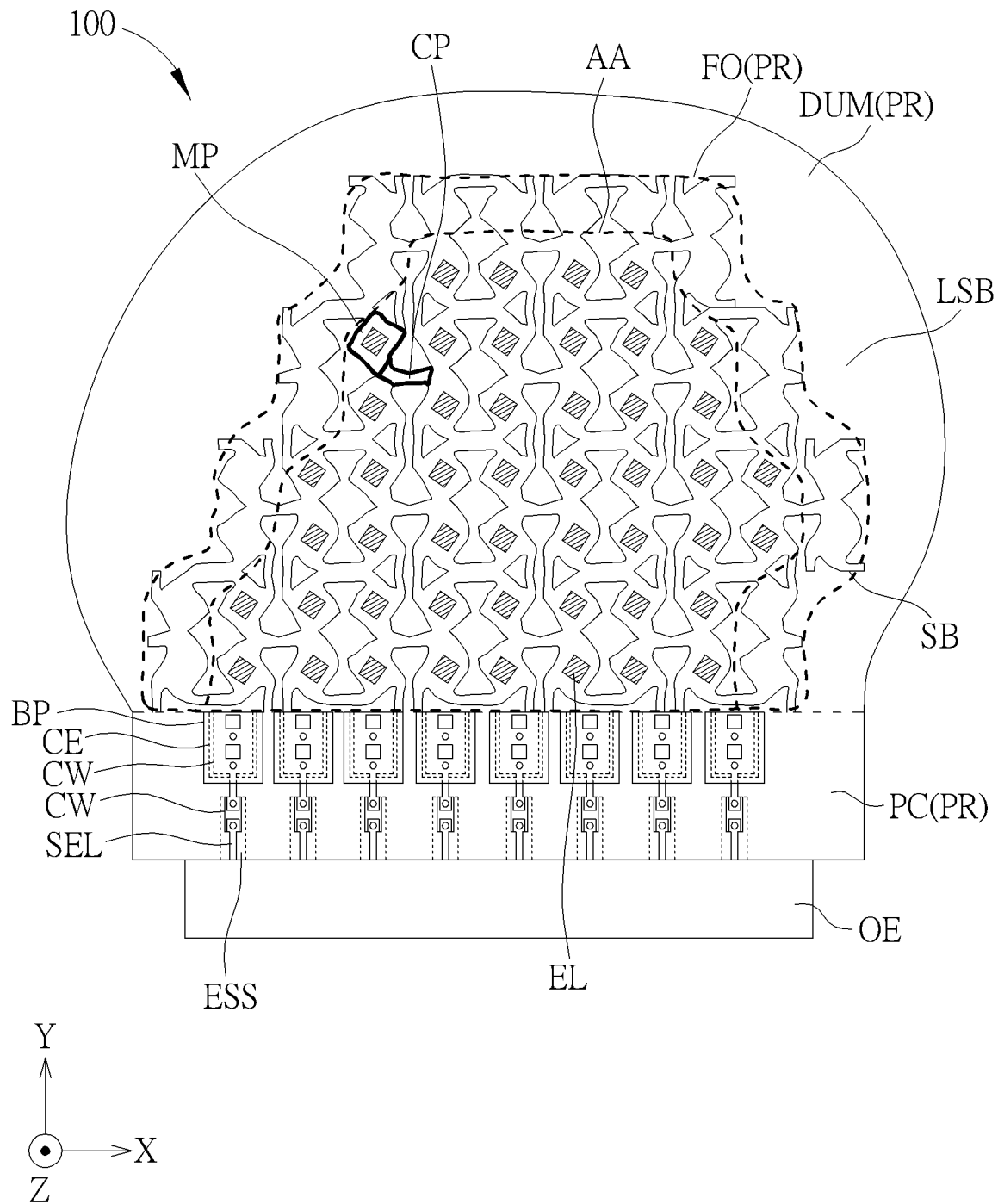
FIG. 1 schematically illustrates a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

According to the present disclosure, the thickness, length and width may be measured through optical microscope, and the thickness or width may be measured through the cross-sectional view in the electron microscope, but not limited thereto.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

In addition, the terms "the given range is from a first value to a second value" or "the given range is located between a first value and a second value" represents that the given range includes the first value, the second value and other values there between.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

It should be noted that the technical features in different embodiments described in the following can be replaced, recombined, or mixed with one another to constitute another embodiment without departing from the spirit of the present disclosure.

The electronic device of the present disclosure may include a display device, a sensing device, a back-light device, an antenna device, a tiled device or other suitable electronic devices, but not limited thereto. The electronic device may be a foldable electronic device, a flexible electronic device or a stretchable electronic device. For example, the electronic device of the present disclosure may include a flexible electronic device. The display device may for example be applied to laptops, common displays, tiled displays, vehicle displays, touch displays, televisions, monitors, smart phones, tablets, light source modules, lighting devices or electronic devices applied to the products mentioned above, but not limited thereto. The sensing device may for example include a biosensor, a touch sensor, a fingerprint sensor, other suitable sensors or combinations of the above-mentioned sensors. The antenna device may for example include a liquid crystal antenna device, but not limited thereto. The tiled device may for example include a tiled display device or a tiled antenna device, but not limited thereto. The outline of the electronic device may be a rectangle, a circle, a polygon, a shape with curved edge or other suitable shapes. The electronic device may include electronic elements, wherein the electronic elements may include passive elements or active elements, such as capacitor, resistor, inductor, diode, transistor, sensors, and the like. The diode may include a light emitting diode or a photo diode. The light emitting diode may for example include an organic light emitting diode (OLED) or an in-organic light emitting diode. The in-organic light emitting diode may for example include a mini light emitting diode (mini LED), a micro light emitting diode (micro LED) or a quantum dot light emitting diode (QLED), but not limited thereto. It should be noted that the electronic device of the present disclosure may be combinations of the above-mentioned devices, but not limited thereto. The display device is taking as an example to describe the contents of the present disclosure in the following, but the present disclosure is not limited thereto.

Figure 2A:
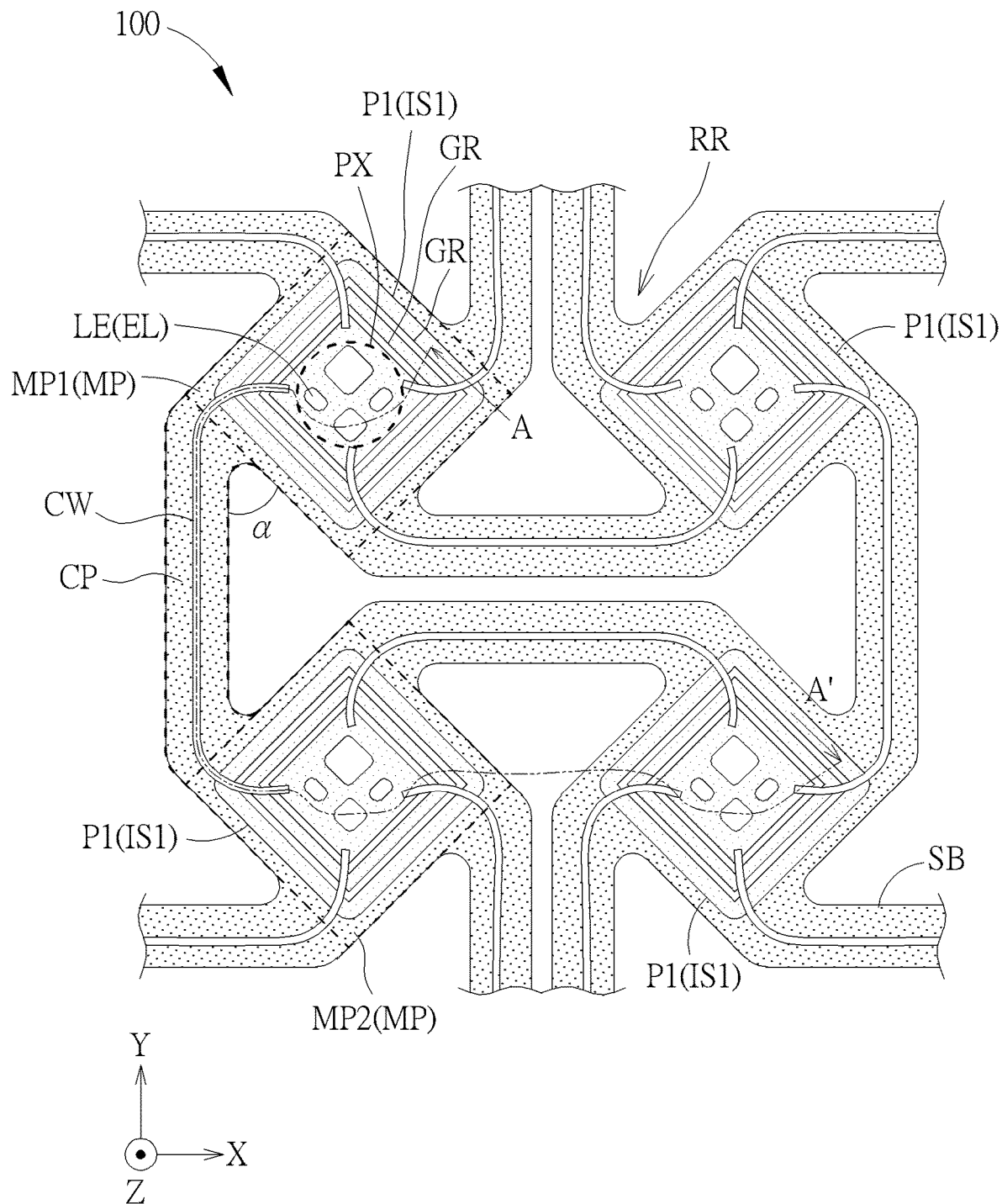
FIG. 2A schematically illustrates a partial enlarged top view of the electronic device according to the first embodiment of the present disclosure.
Figure 2B:
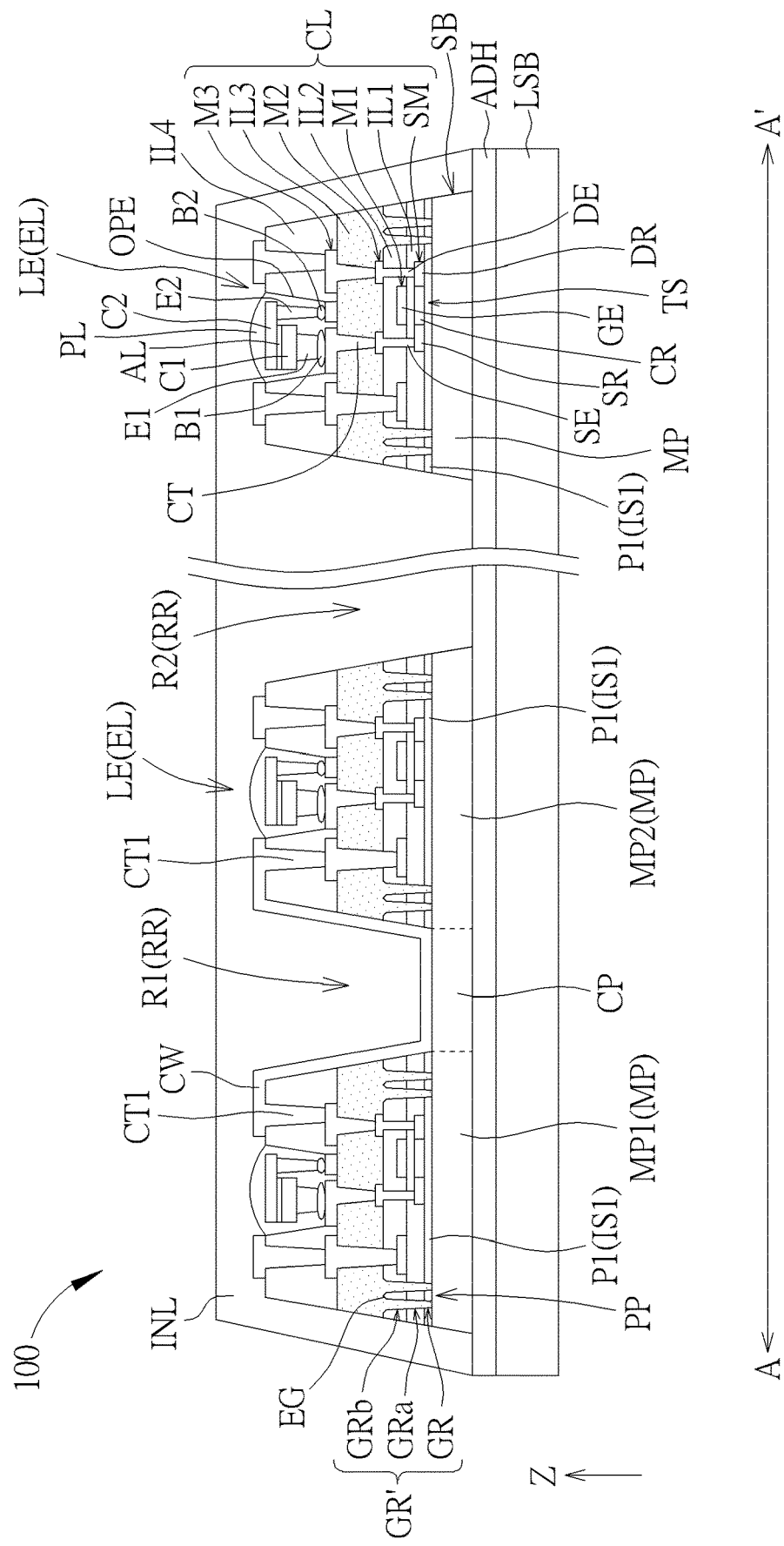
FIG. 2B schematically illustrates a cross-sectional view of the electronic device according to the first embodiment of the present disclosure along a section line A-A'.

Referring to FIG. 1, FIG. 2A and FIG. 2B, FIG. 1 schematically illustrates a top view of an electronic device according to a first embodiment of the present disclosure, FIG. 2A schematically illustrates a partial enlarged top view of the electronic device according to the first embodiment of the present disclosure, and FIG. 2B schematically illustrates a cross-sectional view of the electronic device according to the first embodiment of the present disclosure along a section line A-A'. In order to simplify the figure, FIG. 2A only shows a portion of the layers and the elements of the electronic device, and the detailed structure of the electronic device may refer to FIG. 2B, but not limited thereto. According to the present embodiment, the electronic device 100 may include a supporting substrate LSB, a substrate SB, a circuit layer CL and electronic elements EL, wherein the substrate SB may be disposed on the supporting substrate LSB, the circuit layer CL may be disposed on the substrate SB, and the electronic elements EL may be disposed on the circuit layer CL. The elements and/or the layers included in the electronic device 100 will be detailed in the following.

The supporting substrate LSB may include a flexible substrate, wherein the term "flexible" represents that it can be curved, folded, rolled, stretched or deformed in other ways. For example, the supporting substrate LSB may be a stretchable substrate, but not limited thereto. The material of the flexible substrate may include polyimide (PI), polycarbonate (PC), polyethylene terephthalate (PET), other suitable materials or combinations of the above-mentioned materials. The supporting substrate LSB may be used for supporting the layers and/or the structures disposed thereon. As shown in FIG. 2B, the supporting substrate LSB may for example be attached to a surface of the substrate SB through an adhesive layer ADH, but not limited thereto.

The substrate SB may include a flexible substrate or at least partially be a flexible substrate. For example, the substrate SB may be a stretchable substrate, but not limited thereto. The material of the substrate SB may refer to the material of the above-mentioned supporting substrate LSB, and will not be redundantly described. According to the present embodiment, the substrate SB may be patterned and includes a plurality of main structures MP and a plurality of connecting structures CP, wherein at least one of the connecting structures CP may connect adjacent two of the main structures MP. Specifically, as shown in FIG. 2A, the substrate SB of the electronic device 100 may include a first main structure MP1 and a second main structure MP2 adjacent to the first main structure MP1, wherein the connecting structure CP may be located between the first main structure MP1 and the second main structure MP2 and connect the first main structure MP1 and the second main structure MP2, but not limited thereto. In the present embodiment, the main structures MP may be island-shaped, and the connecting structures CP may be string shaped, but not limited thereto. According to the present embodiment, the main structures MP may be configured to dispose electronic elements EL or other active elements thereon, such as the channel region of the thin film transistor in the circuit layer CL (as shown in FIG. 2B), but not limited thereto. In other words, the electronic elements EL and/or the active elements in the circuit layer CL may be disposed corresponding to the main structures MP. "The electronic elements EL and/or the active elements in the circuit layer CL are disposed corresponding to the main structures MP" mentioned above may represent that the electronic elements EL and/or the active element overlap or at least partially overlap the main structures MP in the top view direction (such as the direction Z, which will not be redundantly described in the following) of the electronic device 100, but not limited thereto. The definition of the term "corresponding to" may be applied to each of the embodiments of the present disclosure, and will not be redundantly described. According to the present embodiment, a connecting structure CP may adjust the distance between the adjacent main structures MP which are connected through the connecting structure CP. For example, when the electronic device 100 is deformed (for example, being stretched), the connecting structures CP may be deformed, such that the size of the connecting structures CP is changed, and the distance between the main structures MP are thereby be changed. In another example, when the electronic device 100 is deformed (for example, being stretched), the included angle (such as the included angle α) between a connecting structure CP and the main structure MP to which the connecting structure CP is connected can be changed due to external force, such that the relative positions of the two adjacent main structures MP can be changed. For example, the shortest distance between the two adjacent main structures MP may be increased. In yet another example, the connecting structures CP with different sizes may be formed through different patterning designs, such that the distance between two adjacent main structures MP may be changed.

According to the present embodiment, the circuit layer CL may be patterned, wherein the circuit layer CL may be disposed on the main structures MP of the substrate SB, but not limited thereto. The circuit layer CL may include any wire, circuit, active element and/or passive element that can be applied to the electronic device 100. For example, the circuit layer CL may include a plurality of transistors TS as the driving units and/or the switch units of the electronic elements EL, but not limited thereto. In detail, the circuit layer CL may include a semiconductor SM, a conductive layer M1, a conductive layer M2 and a conductive layer M3, wherein the semiconductor SM may form a channel region CR, a source region SR and a drain region DR of the transistor TS, and the conductive layer M1 may form a gate electrode GE of the transistor TS. In addition, the conductive layer M2 may be located on the conductive layer M1 and for example form a source electrode SE and a drain electrode DE respectively electrically connected to the source region SR and the drain region DR. The conductive layer M3 may be located on the conductive layer M2 and for example form contacts CT electrically connected to the source electrode SE and the drain electrode DE, but not limited thereto. The material of the semiconductor SM may for example include silicon or metal oxides, such as low temperature polysilicon (LTPS), amorphous silicon (a-Si), low temperature polysilicon oxide (LTPO) or indium gallium zinc oxide (IGZO), but not limited thereto. The conductive layer M1, the conductive layer M2 and the conductive layer M3 may include any suitable conductive material, such as metals, but not limited thereto. As mentioned above, the active elements (such as the transistors TS) in the circuit layer CL of the present embodiment may be disposed on the main structures MP of the substrate SB. Therefore, the semiconductors SM in the transistors TS may be disposed on the main structures MP. As shown in FIG. 2B, the circuit layer CL may further include an insulating layer IL1 located between the semiconductor SM and the conductive layer M1, an insulating layer IL2 located between the conductive layer M1 and the conductive layer M2 and an insulating layer IL3 located between the conductive layer M2 and the conductive layer M3. The insulating layer IL1 and the insulating layer IL2 may include any suitable inorganic insulating material, but not limited thereto. The insulating layer IL1 may for example be the gate insulating layer in the transistor TS. The insulating layer IL3 may include any suitable organic material, such as polyfluoroalkoxy (PFA), but not limited thereto. It should be noted that the structure of the circuit layer CL shown in FIG. 2B is exemplary, and the present embodiment is not limited thereto.

The electronic elements EL of the present embodiment may include light emitting elements LE, such as light emitting diodes, but not limited thereto. In some embodiments, the electronic elements EL may include sensors, diodes, other suitable elements or combinations of the above-mentioned elements. The in-organic light emitting diode is taken as an example of the light emitting element LE to describe the structure of the light emitting element LE in the following, but the present embodiment is not limited thereto. As shown in FIG. 2B, the electronic device 100 may further include an insulating layer IL4 disposed on the circuit layer CL, wherein the insulating layer IL4 may cover the conductive layer M3 of the circuit layer CL, but not limited thereto. The insulating layer IL4 may include any suitable organic insulating material. In the present embodiment, a portion of the insulating layer IL4 may be removed to form at least one opening OPE, wherein the opening OPE may expose a portion of the conductive layer M3 of the circuit layer CL, and the light emitting elements LE may be disposed in the openings OPE and electrically connected to the transistors TS. That is, the insulating layer IL4 may for example serve as the pixel defining layer in the electronic device 100. In detail, the light emitting element LE may include a semiconductor C1, a semiconductor C2, an active layer AL located between the semiconductor C1 and the semiconductor C2, an electrode E1 connected to the semiconductor C1 and an electrode E2 connected to the semiconductor C2, wherein the electrode E1 and the electrode E2 may respectively be electrically connected to the conductive layer M3 through a bonding material B1 and a bonding material B2, such that the light emitting element LE may be electrically connected to the transistor TS or other electronic elements through the contacts CT formed of the conductive layer M3. The bonding material B1 and the bonding material B2 may for example include anisotropic conductive film (ACF), tin, gold-tin alloy, silver glue, other suitable materials or combinations of the above-mentioned materials, but not limited thereto. As mentioned above, the light emitting elements LE (the electronic elements EL) of the present embodiment may be disposed on the main structures MP of the substrate SB or disposed corresponding to the main structures MP. In some embodiments, a light emitting element LE may be disposed on a main structure MP. In some embodiments, as shown in FIG. 2A, multiple light emitting elements LE may be disposed on a main structure MP, and the multiple light emitting elements LE may emit lights of different colors and form a pixel PX, that is, a main structure MP may correspond to a pixel PX. In some embodiments, multiple light emitting elements LE may be disposed on a main structure MP, and the multiple light emitting elements LE may form multiple pixels PX, that is, a main structure MP may correspond to multiple pixels PX. In addition, as shown in FIG. 2B, the electronic device 100 may further include a protecting layer PL, wherein the protecting layer PL may be disposed on the light emitting elements LE and cover the light emitting elements LE to provide protection, but not limited thereto.

As shown in FIG. 2A and FIG. 2B, the electronic device 100 may further include a first insulating structure IS1, wherein the first insulating structure IS1 may be disposed between the substrate SB and the circuit layer CL. The first insulating structure IS1 may include a single-layer structure or a multi-layer structure. In addition, the first insulating structure IS1 may include any suitable organic material and/or inorganic material. The organic material may for example include acrylic resin, epoxy resin, siloxane, silicone, other suitable material or combinations of the above-mentioned materials. The inorganic material may include silicon nitride, silicon oxide, liquid glass, glass glue, titanium dioxide, aluminum oxide, other suitable materials or combinations of the above-mentioned materials. When the first insulating structure IS1 includes the single-layer structure, the first insulating structure IS1 may for example include inorganic materials; and when the first insulating structure IS1 includes the multi-layer structure, the first insulating structure IS1 may for example include a stacked structure formed by stacking an inorganic layer, an organic layer and an inorganic layer in sequence, but not limited thereto. According to the present embodiment, the first insulating structure IS1 may for example serve as the buffer layer of the electronic device 100 to block moisture and/or oxygen from the outside, such that the possibility of damage to the elements in the electronic device 100 due to being affected by moisture and/or oxygen may be reduced.

In the present embodiment, the first insulating structure IS1 may be patterned, such that the first insulating structure IS1 may be disposed on the main structure MP of the substrate SB or disposed corresponding to the main structure MP. In detail, as shown in FIG. 2A, the first insulating structure IS1 may be patterned to be divided into a plurality of island portions P1, and an island portion P1 is disposed corresponding to a main structure MP, but not limited thereto. In such condition, each of the island portions P1 of the first insulating structure IS1 may be isolated and is not connected to other island portions P1. Therefore, the island portions P1 of the first insulating structure IS1 may be island-shaped, but not limited thereto. "The island portion P1 is not connected to other island portions P1" mentioned above may represent that two island portions P1 are not connected through an element including the same material as the first insulating structure IS1 in the top view direction of the electronic device 100, and the pattern of the first insulating structure IS1 is discontinuous in the top view direction. In addition, the first insulating structure IS1 may be disposed between the main structure MP and the semiconductor SM, but not limited thereto. For example, an island portion P1 of the first insulating structure IS1 may be disposed between the first main structure MP1 and a semiconductor SM, and another island portion P1 may be disposed between the second main structure MP2 and another semiconductor SM. In addition, the semiconductors SM on different main structures MP may include different materials or may be semiconductors of different materials in the present embodiment, but not limited thereto. For example, the semiconductor SM on the first main structure MP1 and the semiconductor SM on the second main structure MP2 may be semiconductors of different materials. It should be noted that the structures of the first insulating structure IS1 shown in FIG. 2A and FIG. 2B are exemplary, and the present disclosure is not limited thereto. In some embodiments, a main structure MP may correspond to multiple island portions P1. In some embodiments, a portion of the main structures MP may not correspond to the island portion P1. In some embodiments, the first insulating structure IS1 may be disposed on the main structures MP and the connecting structures CP of the substrate SB, that is, the pattern of the first insulating structure IS1 may substantially be the same as the pattern of the substrate SB. In such condition, the first insulating structure IS1 may be disposed between a main structure MP (such as the first main structure MP1) and a semiconductor SM, and the first insulating structure IS1 may further be disposed between another main structure MP (such as the second main structure MP2) and another semiconductor SM.

According to the present embodiment, the first insulating structure IS1 may have at least one groove GR, wherein the groove GR may for example be formed by removing at least a portion of the first insulating structure IS1. Specifically, the first insulating structure IS1 of the present embodiment may include a plurality of island portions P1, and at least one of the plurality of island portions P1 may have at least one groove GR. For example, as shown in FIG. 2A, an island portion P1 of the first insulating structure IS1 may have two grooves GR, but not limited thereto. Since the island portions P1 of the first insulating structure IS1 may be disposed on the main structures MP, the grooves GR may be disposed on the main structures MP or disposed corresponding to the main structures MP, but not limited thereto. The groove GR may have a ring structure and surrounds the electronic element(s) EL in the top view direction of the electronic device 100, and the groove GR may have any suitable shape, but not limited thereto. For example, as shown in FIG. 2A, an island portion P1 of the first insulating structure IS1 may have two ring-shaped grooves GR, wherein the grooves GR may surround the light emitting elements LE (the electronic elements EL) on the island portion P1 in the top view direction of the electronic device 100. It should be noted that the number and the shape of the grooves GR shown in FIG. 2A are exemplary, and the present disclosure is not limited thereto. In some embodiments, an island portion P1 may have one, three or more grooves GR. In addition, although FIG. 2A shows the structure that the groove GR surrounds a pixel PX formed of multiple light emitting elements LE in the top view direction of the electronic device 100, the present embodiment is not limited thereto. According to the demands of design of the electronic device 100, any number of the electronic elements EL may be disposed on a main structure MP, and the groove(s) GR corresponding to the island portion P1 of the main structure MP may surround these electronic elements EL in the top view direction of the electronic device 100. In some embodiments, the groove(s) GR may surround a light emitting element LE (or electronic element EL) in the top view direction of the electronic device 100; and in some other embodiments, the groove (s) GR may surround multiple pixels PX formed of multiple light emitting elements LE in the top view direction of the electronic device 100, but not limited thereto. "The groove GR surrounds the electronic elements EL in the top view direction of the electronic device 100" mentioned above may represent that the electronic elements EL may be located in the region enclosed by the groove GR in the top view direction of the electronic device 100, but not limited thereto. In other words, the groove GR is not overlapped with the electronic elements EL in the top view direction of the electronic device 100. In addition, as shown in FIG. 2B, the grooves GR of an island portions P1 of the first insulating structure IS1 may further surround the transistor TS and/or the conductive elements located on the island portion P1 in the top view direction of the electronic device 100, but not limited thereto. In other words, the transistors TS and/or the conductive elements may be located in the region enclosed by the groove GR in the top view direction of the electronic device 100.

As shown in FIG. 2B, the grooves GR may penetrate the first insulating structure IS1 in the present embodiment, or in other words, the grooves GR may expose the main structures MP of the substrate SB, but not limited thereto. In some embodiments, the grooves GR may not penetrate the first insulating structure IS1. In addition, in the present embodiment, the insulating layer IL1 and the insulating layer IL2 of the circuit layer CL may respectively have grooves GRa and grooves GRb, wherein the grooves GRa and the grooves GRb may respectively be formed by removing a portion of insulating layer IL1 and a portion of the insulating layer IL2 corresponding to the grooves GR. Accordingly, the grooves GR, the grooves GRa and the grooves GRb may at least overlap each other in the top view direction of the electronic device 100 and form grooves GR', wherein the grooves GR' may penetrate the insulating layer IL1, the insulating layer IL2 and at least a portion of the first insulating structure IS1. In such condition, the insulating layer IL3 disposed on the insulating layer IL2 may be filled into the grooves GR', that is, the organic materials of the insulating layer IL3 may be filled into the grooves GR, but not limited thereto. In some embodiments, a portion of the insulating layer IL3 corresponding to the grooves GR may be removed to form grooves corresponding to the grooves GR, and the grooves GR' may further include the grooves of the insulating layer IL3. In such condition, the insulating layer IL4 disposed on the insulating layer IL3 may be filled in the grooves GR', that is, the organic materials of the insulating layer IL4 may be filled into the grooves GR. In other words, in the present embodiment, at least a portion of the inorganic insulating layers (such as the insulating layer IL1 and the insulating layer IL2) of the circuit layer CL corresponding to the grooves GR may be removed, and the organic insulating layers (such as the insulating layer IL3 and the insulating layer IL4) may be filled into the grooves GR, but not limited thereto. It should be noted that the structure shown in FIG. 2B is exemplary, and the present disclosure is not limited thereto. In some embodiments, any suitable portion of the insulating layer IL1 and the insulating layer IL2 may be removed to expose at least a portion of the grooves GR, and the insulating layer IL3 may be filled into the grooves GR.

When the electronic device 100 is deformed (such as being stretched), edges of the substrate SB or the layers (such as the first insulating structure IS1) disposed thereon may crack due to stress, thereby forming a conducting path for moisture and/or oxygen. According to the present embodiment, since the first insulating structure IS1 of the electronic device 100 may include the grooves GR, the possibility of cracks extending toward the inside of the electronic device 100 may be reduced. Specifically, the grooves GR disposed on the first insulating structure IS1 may be used to block the cracks to reduce the condition that the cracks extend inward from the grooves GR. In addition, since the grooves GR may surround the electronic elements EL and/or the active elements (such as the transistors TS) in the top view direction of the electronic device 100, the possibility that the cracks extend to the electronic elements EL and/or the active elements may be reduced. Accordingly, the influence of moisture and/or oxygen on electronic elements EL and/or active elements may be reduced, and the performance or lifespan of the electronic device 100 may be improved. In addition, since the insulating layer including organic materials may be filled into the grooves GR, the possibility of cracks in the insulating layer in the grooves GR may be reduced, thereby improving the effect of blocking the cracks of the grooves GR.

As shown in FIG. 2B, the electronic device 100 may include at least one protruding portion PP located on the main structures MP of the substrate SB. The protruding portions PP of the present embodiment may for example be formed through the grooves GR', but not limited thereto. Since the protruding portion PP may be formed according to the shape of the groove GR', the structure of the groove GR' may be designed, such that the structure of the protruding portion PP or the layers included in the protruding portion PP may be varied. For example, the groove GR' of the present embodiment may be formed by removing a portion of the first insulating structure IS1, a portion of the insulating layer IL1 and a portion of the insulating layer IL2, and the protruding portion PP formed through the groove GR' may include a portion of the first insulating structure IS1, a portion of the insulating layer IL1 and a portion of the insulating layer IL2, but not limited thereto. In other words, the protruding portion PP of the present embodiment may be formed of the first insulating structure IS1, the insulating layer IL1 and the insulating layer IL2. According to the present embodiment, the protruding portion PP may have an edge EG, wherein the edge EG may be arc-shaped, curved or include any suitable non-sharp corner design, but not limited thereto. Since the edge EG of the protruding portion PP may not include sharp corner design, the stress on the protruding portion PP may be reduced, such that the possibility of cracks in the protruding portion PP may be reduced, thereby improving the performance or lifespan of the electronic device 100. The design of the protruding portion PP of the present embodiment may be applied to each of the embodiments in the following, and will not be redundantly described. It should be noted that the structure of the protruding portion PP shown in FIG. 2B is exemplary, and the present disclosure is not limited thereto.

As shown in FIG. 2A and FIG. 2B, the electronic device 100 may further include at least one conductive wire CW, wherein the conductive wire CW may be disposed on the connecting portion CP and extend on the connecting portion CP. In addition, two ends of the conductive wire CW may respectively extend to two adjacent main structures MP (such as the first main structure MP1 and the second main structure MP2) and be electrically connected to the electronic elements EL on the two adjacent main structures MP, such that two electrical elements EL located on different main structures MP may be electrically connected to each other. That is, electrical signals may be transmitted between the transistors TS on different main structures MP through the conductive wire CW, but not limited thereto. In detail, after the above-mentioned patterning process of the substrate SB and/or the patterning process of the first insulating structure IS1, a portion of the substrate SB, a portion of the first insulating structure IS1, a portion of the insulating layer IL1, a portion of the insulating layer IL2, a portion of the insulating layer IL3 and a portion of the insulating layer IL4 may be removed to form a recess region RR in the electronic device 100. The recess region RR may be formed through the patterning processes of the substrate SB and/or the first insulating structure IS1. The recess region RR may include a first area R1 corresponding to the connecting structures CP and a second area R2 not corresponding to the connecting structures CP, wherein the first area R1 may be formed by removing a portion of the insulating layer IL1, a portion of the insulating layer IL2, a portion of the insulating layer IL3 and a portion of the insulating layer IL4, and the second area R2 may be formed by removing a portion of the insulating layer IL1, a portion of the insulating layer IL2, a portion of the insulating layer IL3, a portion of the insulating layer IL4 and a portion of the substrate SB, but not limited thereto. Specifically, the portion of the substrate SB corresponding to the first area R1 may not be removed and form the connecting structures CP, and the portion of the substrate SB corresponding to the second area R2 may be removed and expose the adhesive layer ADH or the supporting substrate LSB. In the present embodiment, the conductive wire CW may extend into the first area R1 corresponding to the connecting structures CP, or a portion of the conductive wire CW may extend along the sidewall and bottom surface of the first area R1. In addition, two ends of the conductive wire CW may respectively extend on two adjacent main structures MP and be electrically connected to the elements (such as transistors TS) in the main structures MP through the contacts CT1, but not limited thereto. Accordingly, at least a portion of the conductive wire CW may be disposed on the first insulating structure IS1 and extends from the main structure MP to the connecting structure CP. As shown in FIG. 2B, since the first insulating structure IS1 includes the grooves GR, the conductive wire CW may cross the grooves GR when it extends from the main structure MP (such as the first main structure MP1) to the connecting structure CP, but not limited thereto. "The conductive wire CW crosses the groove GR" mentioned above may represent that the conductive wire CW may pass through the groove GR in the top view direction of the electronic device 100, but not limited thereto.

As shown in FIG. 2B, the electronic device 100 may further include an insulating layer INL in addition to the above-mentioned elements and/or layers, wherein the insulating layer INL may be used to encapsulate the layers and the electronic elements (such as the electronic elements EL, the conductive wire CW, and the like) between the insulating layer INL and the supporting substrate LSB to provide protection, but not limited thereto. The material of the insulating layer INL may refer to the material of the insulating layer IL1 mentioned above, and will not be redundantly described.

As shown in FIG. 1, the electronic device 100 may include an active region AA and a peripheral region PR. The active region AA may be the region of the electronic device 100 including the electronic elements EL. For example, the active region AA may be defined as the region enclosed by the outer edge of the outermost electronic elements EL among the plurality of electronic elements EL, and the region other than the active region AA may be defined as the peripheral region PR, but not limited thereto. The peripheral region PR may include a fan out region FO and a dummy region DUM, but not limited thereto. The fan out region FO may include conductive wires, wires or other suitable electronic elements, such that the signal lines (such as the conductive wire CW) of the electronic elements EL may be pulled out and be electrically connected to outer electronic elements. The dummy region DUM may be the region of the electronic device 100 not including conductive element (such as electronic elements, wires, and the like). For example, the dummy region DUM may include the supporting substrate LSB, but not limited thereto. In addition, the peripheral region PR may further include a peripheral circuit region PC, wherein at least one bonding pad BP may be disposed in the peripheral circuit region PC, and the signal lines (such as the conductive wire CW) in the electronic device 100 may be electrically connected to the bonding pad BP and be electrically connected to an outer electronic element OE through the bonding pad BP. The outer electronic element OE may for example include a flexible printed circuit board (FPCB), but not limited thereto. It should be noted that the ranges of the active region AA and the peripheral region PR shown in FIG. 1 are exemplary, and the present disclosure is not limited thereto. Moreover, the electronic device 100 may optionally include an electrostatic discharge (ESD) protecting element ESS, wherein the ESD protecting element ESS may for example be disposed in the peripheral circuit region PC, but not limited thereto. The ESD protecting element ESS may for example include a connecting element CE and a conductive layer SEL, wherein the bonding pad BP and the conductive wire CW may be electrically connected to the connecting element CE, and the connecting element CE may be electrically connected to the conductive layer SEL. That is, the bonding pad BP and the conductive wire CW may be electrically connected to the conductive layer SEL through the connecting element CE. The conductive layer SEL may include any suitable conductive material, such as metal materials (for example, titanium, aluminum, copper or other suitable metal materials) or semiconductors, but not limited thereto. The ESD protecting element ESS may discharge the static electricity accumulated on the bonding pad BP and/or the conductive wire CW, or prevent the static charge from accumulating on the bonding pad BP and/or the conductive wire CW. Therefore, the possibility of damage of the electronic elements in the electronic device 100 due to electrostatic discharge may be reduced.

It should be noted that the structure of the electronic device of the present disclosure is not limited to the above-mentioned electronic device 100. Other embodiments of the present disclosure will be described in the following. In order to simplify the description, the same elements or layers in the following embodiments would be labeled with the same symbol, and the features thereof will not be redundantly described. The differences between the embodiments will be detailed in the following.

Figure 3A:
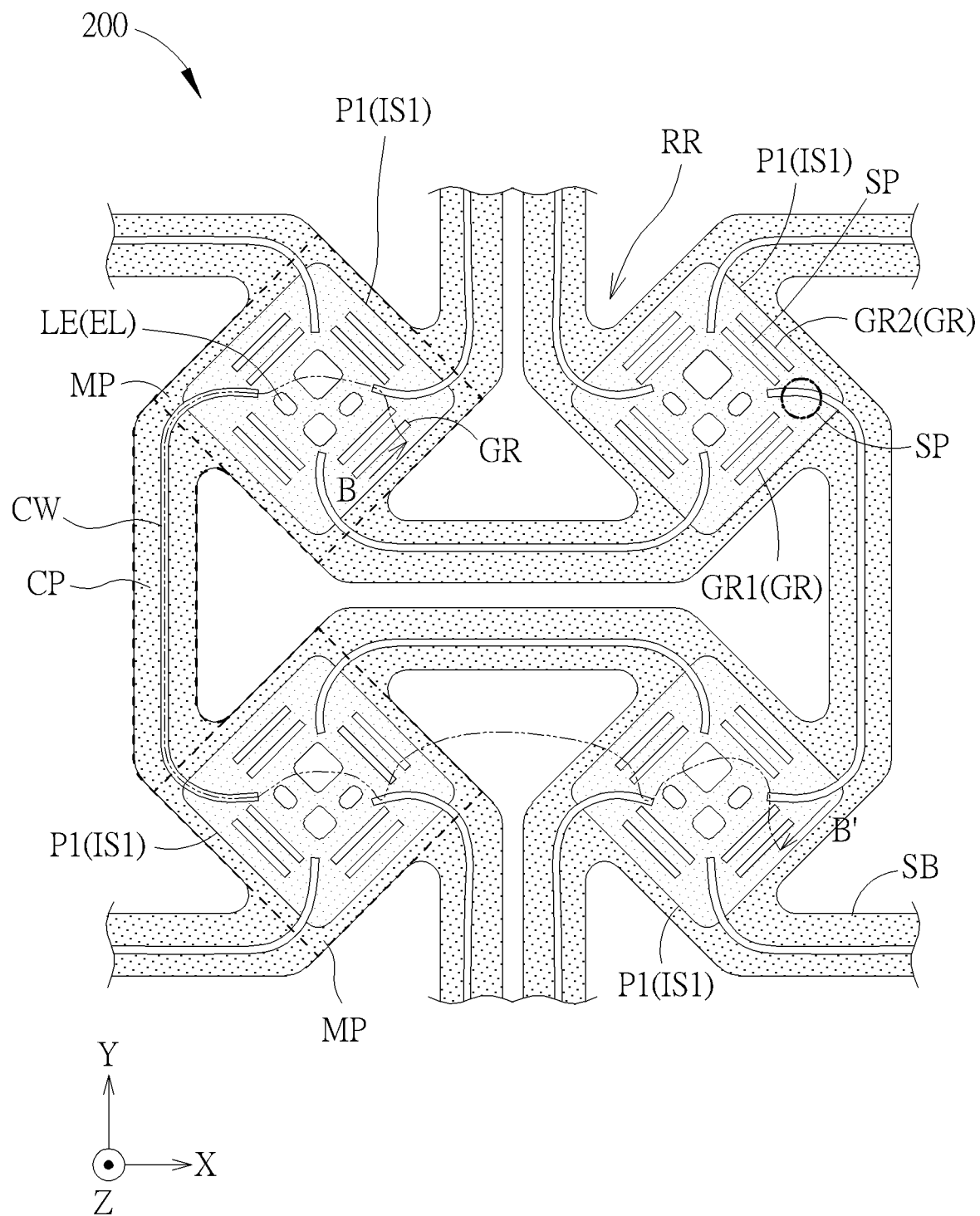
FIG. 3A schematically illustrates a partial enlarged top view of an electronic device according to a second embodiment of the present disclosure.
Figure 3B:
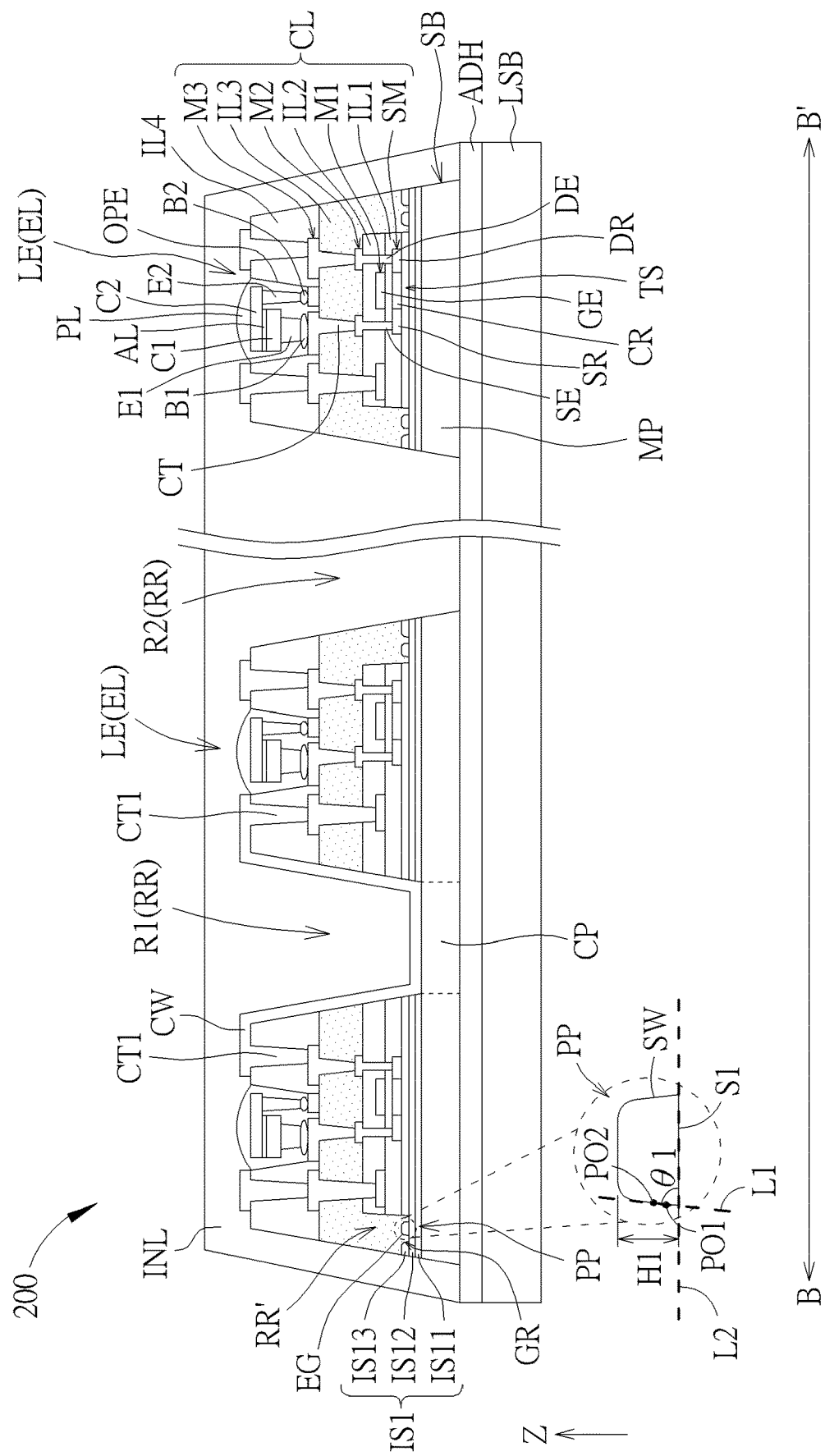
FIG. 3B schematically illustrates a cross-sectional view of the electronic device according to the second embodiment of the present disclosure along a section line B-B'.

Referring to FIG. 3A and FIG. 3B, FIG. 3A schematically illustrates a partial enlarged top view of an electronic device according to a second embodiment of the present disclosure, and FIG. 3B schematically illustrates a cross-sectional view of the electronic device according to the second embodiment of the present disclosure along a section line B-B'. In order to simplify the figure, FIG. 3A just show a portion of the layers and the elements of the electronic device, and the detailed structure of the electronic device may refer to FIG. 3B, but not limited thereto. The first insulating structure IS1 of the electronic device 200 of the present embodiment may include a plurality of island portions P1 respectively disposed corresponding to the main structures MP, but not limited thereto. According to the present embodiment, an island portion P1 of the first insulating structure IS1 may have multiple grooves GR, a spacing SP may be included between two of the grooves GR, and the conductive wire CW may pass through the spacing SP and extend from the main structure MP to the connecting structure CP, but not limited thereto. Specifically, compared with the first embodiment mentioned above, the conductive wire CW of the present embodiment may pass through the spacing SP between the grooves GR and not cross the groove GR. For example, as shown in FIG. 3A, in the electronic device 200, an island portion P1 of the first insulating structure IS1 may have eight grooves GR, and the grooves GR may be disposed along four edges of the island portion P1 in groups of two and located at the periphery of the electronic elements EL on the island portion P1, but not limited thereto. Accordingly, the possibility that the cracks extend from the edges (such as the edges of the main structure MP and/or the edges of the island portion P1, but not limited thereto) to the electronic elements EL and/or the active elements may be reduced through the grooves GR. In addition, a spacing SP may be included between two grooves (such as the groove GR1 and the groove GR2) in an island portion P1 to separate the two grooves GR, and the conductive wire CW may pass through the spacing SP and extend from the main structure MP to the connecting structure CP, but not limited thereto. In the present embodiment, the position of the spacing SP may be adjacent to the connecting structure CP, such that the conductive wire CW may pass through the spacing SP and extend to the connecting structure CP, but not limited thereto. It should be noted that although the conductive wire CW in the structure shown in FIG. 3B extends to the connecting structure CP and contacts the connecting structure CP, the present disclosure is not limited thereto. In some embodiments, the insulating layer IL3 may extend to the connecting structure CP and contact the connecting structure CP, and the conductive wire CW may be disposed on the insulating layer IL3. In such condition, the insulating layer IL3 may be located between the conductive wire CW and the connecting structure CP to reduce the possibility of damage to the conductive wire CW due to stress. As shown in FIG. 3B, since the conductive wire CW may not cross the groove GR, the conductive wire CW may not overlap the groove GR in the top view direction of the electronic device 200, but not limited thereto. According to the present embodiment, by making the conductive wire CW passing through the spacing SP between the grooves GR and not cross the groove GR, the influence of the manufacturing process of the groove GR on the disposition of the conductive wire CW may be reduced, thereby reducing the possibility of damage to the conductive wire CW. It should be noted that FIG. 3A just exemplarily shows the structure that the conductive wire CW passes through the spacing SP between the grooves GR, and number and position of the grooves GR and position of the spacing SP of the island portion P1 of the present embodiment are not limited to what is shown in FIG. 3A. According to the demands of design of the product, the grooves GR of the island portion P1 may have any suitable number and/or position, and the position of the spacing SP may be defined through the position of the grooves GR. In addition, the numbers and/or positions of the grooves GR of different island portions P1 may be different in some embodiments.

In addition, as shown in FIG. 3B, the first insulating structure IS1 of the present embodiment may include a multi-layer structure, and the grooves GR may not penetrate through the first insulating structure IS1, but not limited thereto. Specifically, the grooves GR of the present embodiment may be formed by removing a portion of the layers in the multi-layer structure of the first insulating structure IS1. For example, as shown in FIG. 3B, the first insulating structure IS1 may include a first insulating layer IS11, a second insulating layer IS12 and a third insulating layer IS13, and the grooves GR may be formed by removing a portion of the third insulating layer IS13, and the second insulating layer IS12 may be exposed, but not limited thereto. In some embodiments, the grooves GR may be formed by removing a portion of the second insulating layer IS12 and a portion of the third insulating layer IS13, and the first insulating layer IS11 may be exposed. The first insulating layer IS11 and the third insulating layer IS13 may for example include silicon oxide, and the second insulating layer IS12 may for example include silicon nitride, but not limited thereto. In some embodiments, the first insulating structure IS1 may include any suitable single-layer structure or multi-layer structure according to the demands of design of the product. The feature that the first insulating structure IS1 includes the multi-layer structure may be applied to each of the embodiments of the present disclosure.

In addition, the portions of the insulating layer IL1 and the insulating layer IL2 located on the grooves GR may be removed to form a recess region RR' in the present embodiment, wherein the recess region RR' may expose the grooves GR. In other words, compared with the above-mentioned first embodiment, the insulating layer IL1 and the insulating layer IL2 may not include the groove corresponding to the groove GR of the first insulating structure IS1 in the present embodiment. After the recess region RR' is formed, the insulating layer IL3 may extend downward and be filled into the recess region RR' and the grooves GR, but not limited thereto. In some embodiments, the formation of the recess region RR' may further include removing the portion of the insulating layer IL3 located on the grooves GR, that is, the recess region RR' may be formed by removing a portion of the insulating layer IL1, a portion of the insulating layer IL2 and a portion of the insulating layer IL3, and the insulating layer IL4 may extend downward and be filled into the recess region RR' and the grooves GR. Since the insulating layer IL1 and/or the insulating layer IL2 of the present embodiment may not include groove, and the grooves GR of the first insulating structure IS1 may be formed by removing a portion of the third insulating layer IS13 of the first insulating structure IS1, the protruding portion PP located on the main structure MP may include a portion of the third insulating layer IS13, or the protruding portion PP may be formed of the third insulating layer IS13, but not limited thereto. The structural features of the insulating layer IL1, the insulating layer IL2 and the protruding portion PP may be applied to each of the embodiments of the present disclosure.

According to the present embodiment, as shown in FIG. 3B, an included angle θ1 may be included between the sidewall SW and the bottom surface S1 of the protruding portion PP, wherein the included angle θ1 may be greater than or equal to 80 degrees and less than 90 degrees (that is, 80°≤θ1<90°), but not limited thereto. In other words, the included angle θ1 may be an acute angle which is greater than or equal to 80 degrees. In the present embodiment, the included angle θ1 may be defined as the acute angle between an extending line L1 and an extending line L2, wherein the extending line L1 may be the extending line formed by connecting a point P01 and a point P02 on the sidewall SW of the protruding portion PP, and the extending line L2 may be the extending line passing through the bottom surface S1 of the protruding portion PP (also the upper surface of the second insulating layer IS12 or the upper surface of the substrate SB). The point P01 may be defined as the point on the sidewall SW of the protruding part PP with a height of 10% of the height H1 of the protruding portion PP, and the point P02 may be defined as the point on the sidewall SW of the protruding part PP with a height of 50% of the height H1 of the protruding portion PP, but not limited thereto. After the point P01 and the point P02 are defined, the extending line L1 may be defined by connecting the point P01 and the point P02, and the acute angle between the extending line L1 and the extending line L2 may be defined as the included angle θ1. By making the included angle θ1 between the sidewall SW and the bottom surface S1 of the protruding portion PP within the above-mentioned range, the stress on the protruding portion PP may be dispersed, and possibility of cracks in the protruding portion PP may be reduced.

Figure 4A:
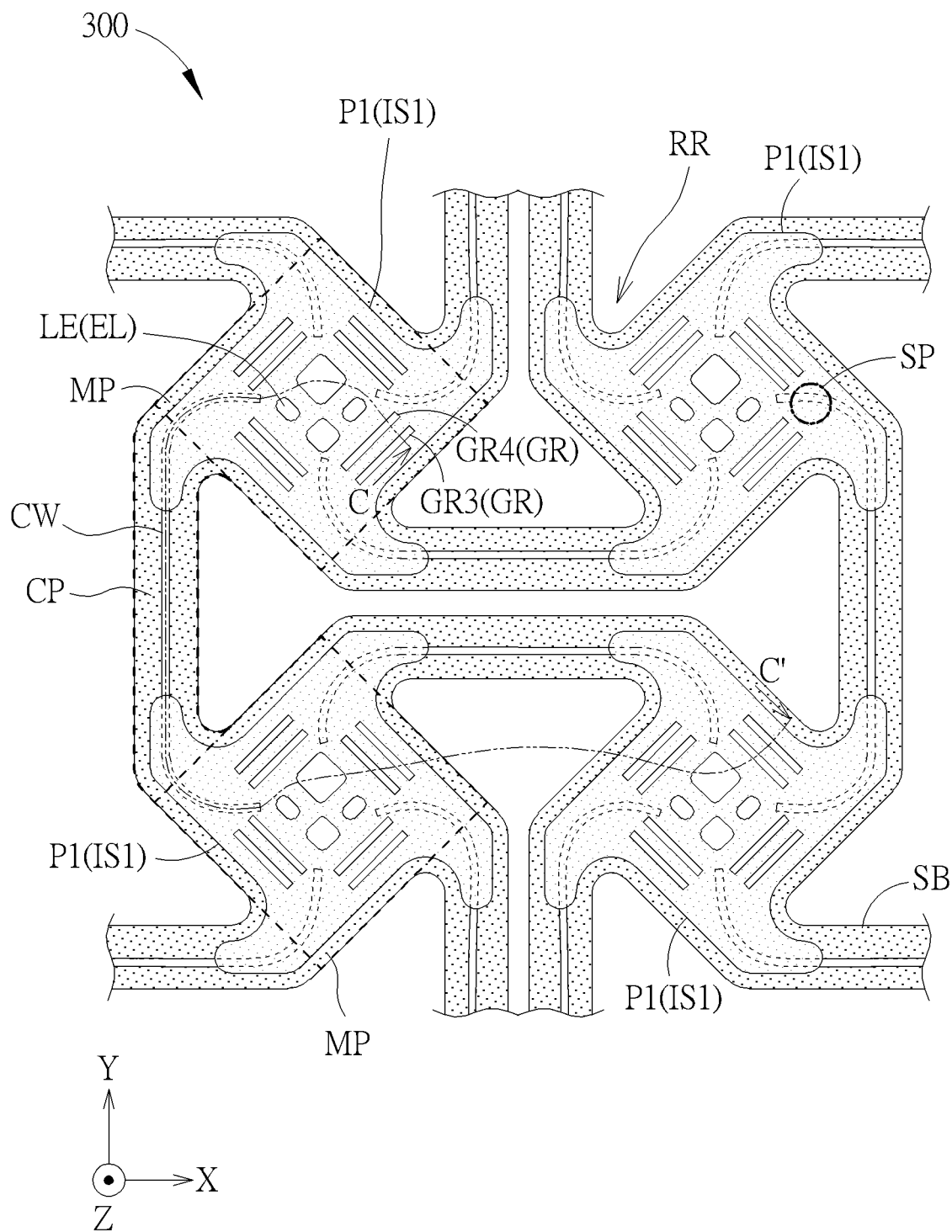
FIG. 4A schematically illustrates a partial enlarged top view of an electronic device according to a third embodiment of the present disclosure.
Figure 4B:
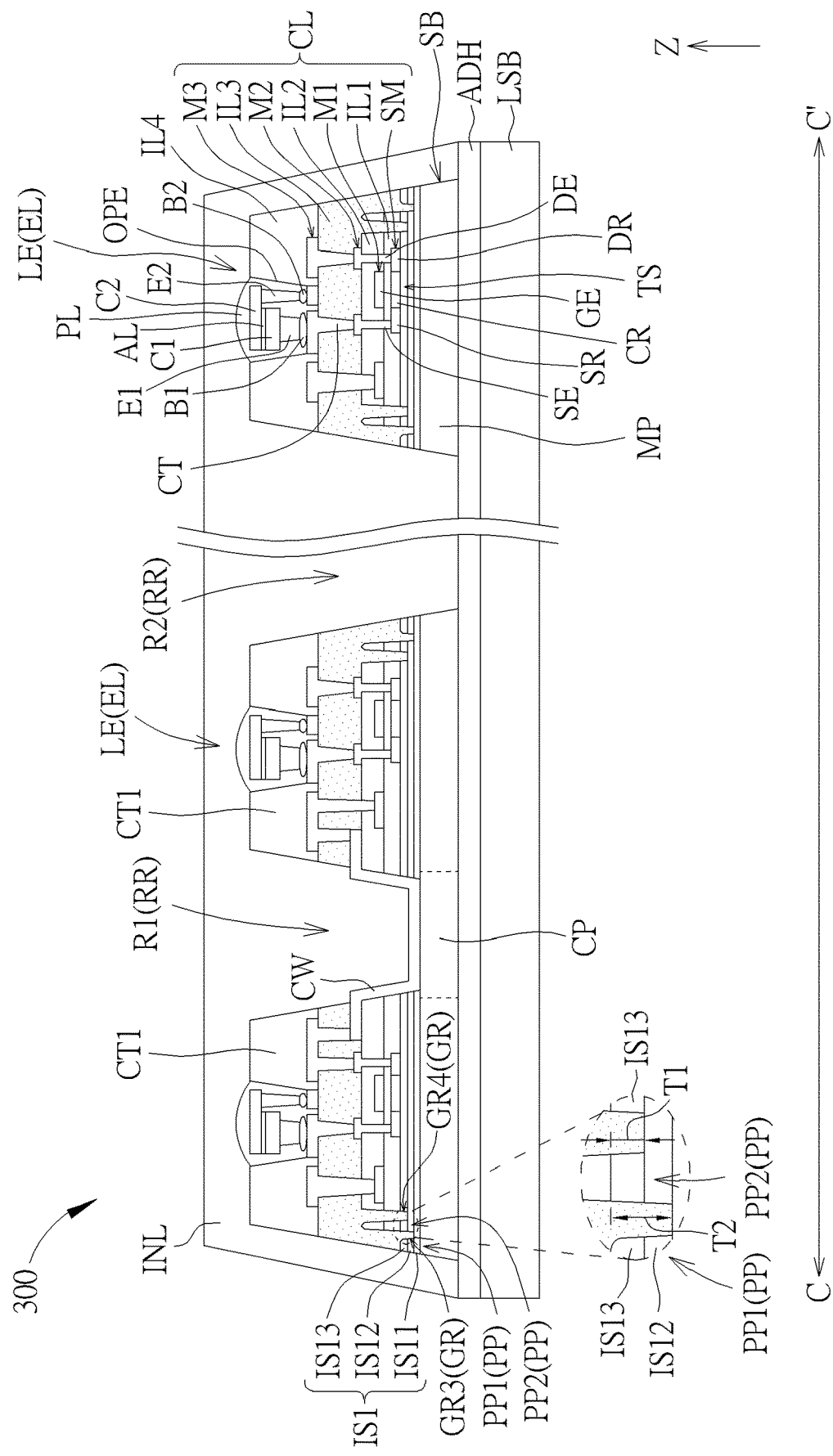
FIG. 4B schematically illustrates a cross-sectional view of the electronic device according to the third embodiment of the present disclosure along a section line C-C'.

Referring to FIG. 4A and FIG. 4B, FIG. 4A schematically illustrates a partial enlarged top view of an electronic device according to a third embodiment of the present disclosure, and FIG. 4B schematically illustrates a cross-sectional view of the electronic device according to the third embodiment of the present disclosure along a section line C-C'. In order to simplify the figure, FIG. 4A just show a portion of the layers and the elements of the electronic device 300, and the detailed structure of the electronic device 300 may refer to FIG. 4B, but not limited thereto. In the present embodiment, the first insulating structure IS1 of the electronic device 300 may include a plurality of island portions P1 respectively disposed corresponding to the main structures MP, but not limited thereto. According to the present embodiment, a portion of the island portion P1 may protrude from the main structure MP and extend to the connecting structure CP in the top view direction of the electronic device 300. In other words, the island portion P1 may at least partially overlap the connecting structure CP in the top view direction of the electronic device 300, but not limited thereto. It should be noted that the pattern of the island portion P1 shown in FIG. 4A is exemplary, and the present disclosure is not limited thereto.

In the present embodiment, an island portion P1 of the first insulating structure IS1 may have the plurality of grooves GR, the spacing SP may be included between two of the grooves GR, and the conductive wire CW may pass through the spacing SP and extend from the main structure MP to the connecting structure CP. The feature that the conductive wire CW passes through the spacing SP may refer to the structures shown in FIG. 2A and FIG. 2B, and will not be redundantly described. Since the conductive wire CW may not cross the groove GR in the present embodiment, the influence of the groove GR on the disposition of the conductive wire CW may be reduced. According to the present embodiment, the conductive wire CW may be disposed on the insulating layer(s) (such as the insulating layer IL1, the insulating layer IL2 or the insulating layer IL3) of the circuit layer CL, but not limited thereto. In other words, the conductive wire CW may extend on the insulating layer(s) of the circuit layer CL. For example, as shown in FIG. 4B, since the conductive wire CW does not cross the groove GR, the conductive wire CW may extend on the insulating layer IL2 (or disposed between the insulating layer IL2 and the insulating layer IL3) and extend from the main structure MP to the connecting structure CP. In such condition, the conductive wire CW may for example be formed of the conductive layer M2, but not limited thereto. By making the conductive wire CW disposed between the insulating layer IL2 and the insulating layer IL3, the height difference between the portion of the conductive wire CW corresponding to the main structure MP and the other portion of the conductive wire CW corresponding to the connecting structure CP may be reduced, such that the possibility of cracks in the conductive wire CW may be reduced. It should be noted that the structure shown in FIG. 4B is exemplary, and the present disclosure is not limited thereto. In some embodiments, the conductive wire CW may extend on the insulating layer IL1 or the insulating layer IL3.

In addition, the depths of the grooves GR of the first insulating structure IS1 (or the island portion P1) may be different in the present embodiment. For example, as shown in FIG. 4B, the first insulating structure IS1 of the present embodiment may include the first insulating layer IS11, the second insulating layer IS12 and the third insulating layer IS13, wherein the groove GR3 of the first insulating structure IS1 may be formed by removing a portion of the second insulating layer IS12 and a portion the third insulating layer IS13, and the groove GR4 of the first insulating structure IS1 may be formed by removing a portion of the third insulating layer IS13, but not limited thereto. Accordingly, the depth T2 of the groove GR3 and the depth T1 of the groove GR4 may be different, wherein the depth T2 may be greater than the depth T1. It should be noted that the first insulating structure IS1 of the present embodiment is not limited to a multi-layer structure. In some embodiments, the first insulating structure IS1 may include a single-layer structure, and the grooves GR may be formed by removing the single-layer structure in different degrees, such that the depths of the grooves GR may be different. The depth of the groove GR may for example be measured from the cross-sectional image of the groove GR in the electron microscope, but not limited thereto. The feature that the depths of the grooves GR are different in the present embodiment may be applied to each of the embodiments of the present disclosure, and will not be redundantly described. In addition, different protruding portions PP may include different layers or different structures in the present embodiment. For example, as shown in FIG. 4B, the protruding portion PP1 may include a portion of the second insulating layer IS12 and a portion the third insulating layer IS13, but not include the insulating layer IL1 and the insulating layer IL2; the protruding portion PP2 may include a portion of the third insulating layer IS13, a portion of the insulating layer IL1 and a portion of the insulating layer IL2, but not limited thereto.

Figure 5A:
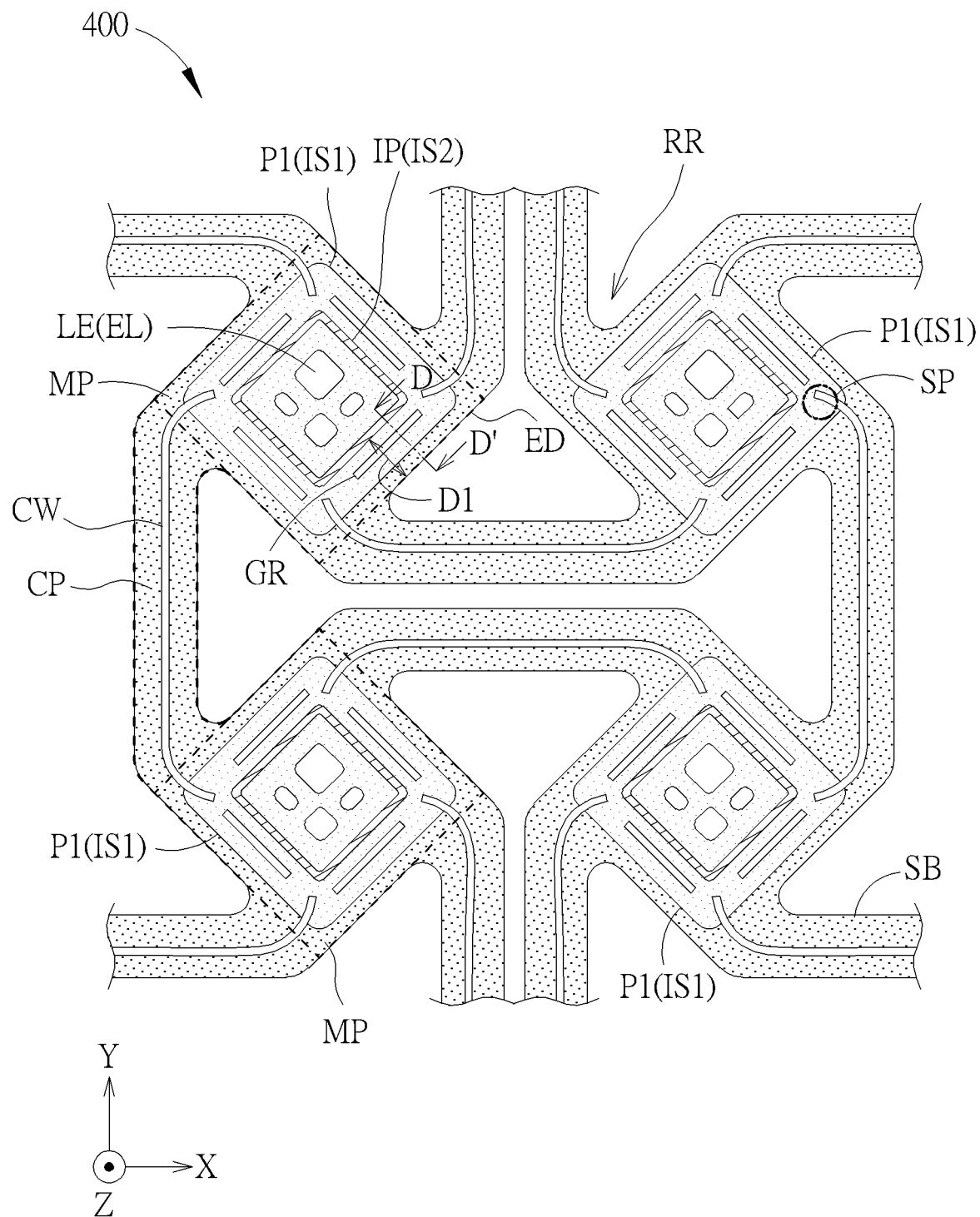
FIG. 5A schematically illustrates a partial enlarged top view of an electronic device according to a fourth embodiment of the present disclosure.
Figure 5B:
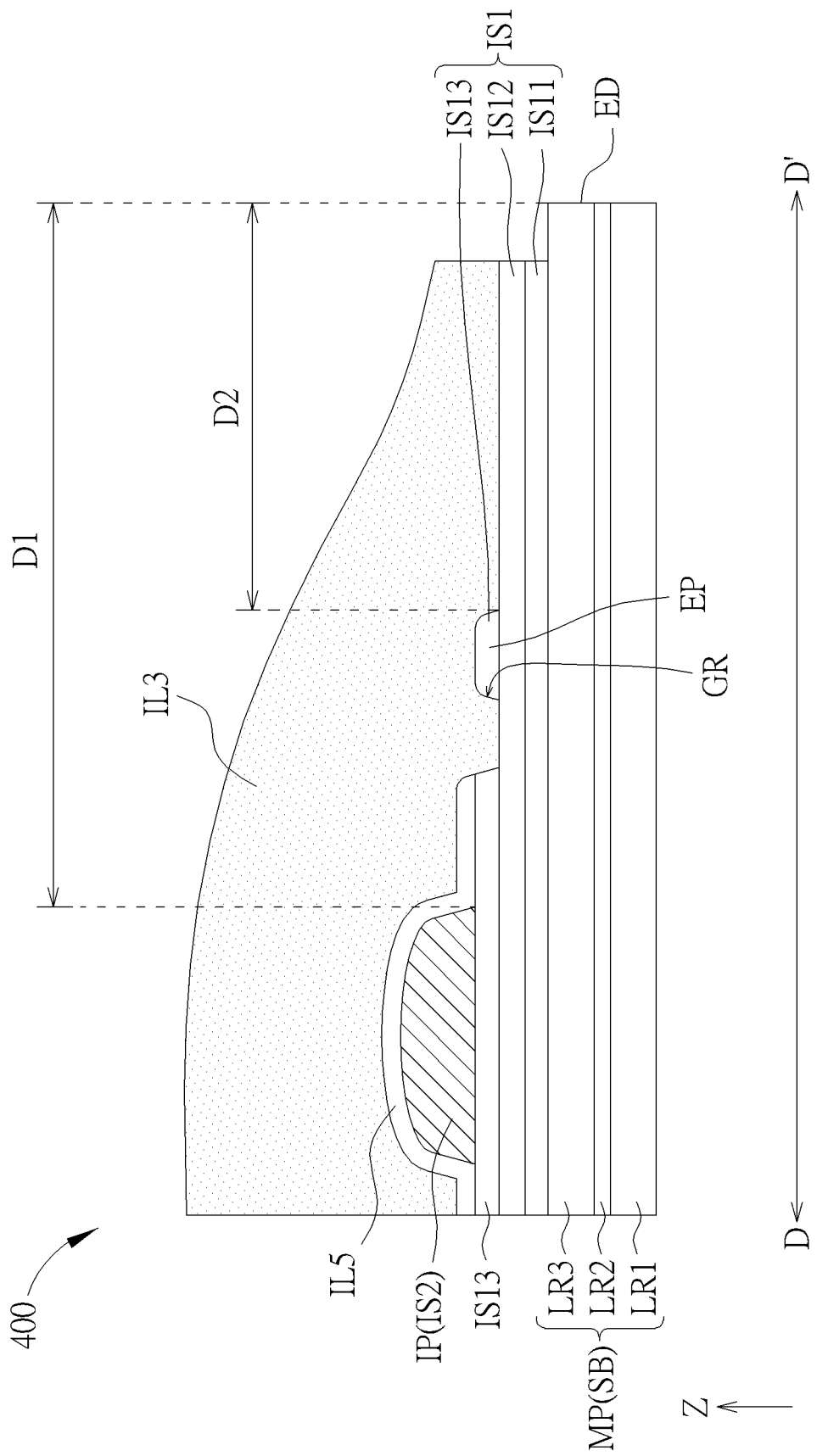
FIG. 5B schematically illustrates a cross-sectional view of the electronic device according to the fourth embodiment of the present disclosure along a section line D-D'.

Referring to FIG. 5A and FIG. 5B, FIG. 5A schematically illustrates a partial enlarged top view of an electronic device according to a fourth embodiment of the present disclosure, and FIG. schematically illustrates a cross-sectional view of the electronic device according to the fourth embodiment of the present disclosure along a section line D-D'. In order to simplify the figure, FIG. 5A just shows a portion of the layers and the elements of the electronic device. In addition, FIG. 5B shows the cross-sectional structure of a portion of the electronic device 400 at the edge of the main structure MP. According to the present embodiment, the electronic device 400 may further include the second insulating structure IS2 in addition to the above-mentioned elements and/or layers, wherein the second insulating structure IS2 may be disposed on the first insulating structure IS1. For example, as shown in FIG. the second insulating structure IS2 of the electronic device 400 may be disposed on the first insulating structure IS1 and in contact with the first insulating structure IS1, but not limited thereto. Specifically, a portion of the insulating layer IL1 (not shown) and a portion of the insulating layer IL2 (not shown) of the circuit layer CL (not shown) of the electronic device 400 may be removed and expose a portion of the first insulating structure IS1, and the second insulating structure IS2 may be disposed on the exposed portion of the first insulating structure IS1 and in contact with the first insulating structure IS1, but not limited thereto. In addition, after the portion of the insulating layer IL1 and the portion of the insulating layer IL2 are removed, the groove(s) GR of the first insulating structure IS1 may be exposed. The second insulating structure IS2 of the present embodiment may have an insulating portion IP, or the second insulating structure IS2 may be formed of the insulating portion IP. That is, the insulating portion IP may be disposed on the first insulating structure IS1. The insulating portion IP may include any suitable organic material, but not limited thereto. In other words, the second insulating structure IS2 may include organic materials. It should be noted that the structure shown in FIG. 5B is exemplary, and the present disclosure is not limited thereto. In some embodiments, the portions of the insulating layer IL1 and/or the insulating layer IL2 located on the portion of the first insulating structure IS1 shown in FIG. 5B not corresponding to the groove GR and the second insulating structure IS2 may not be removed.

As shown in FIG. 5B, the electronic device 400 may further include an insulating layer IL5, wherein the insulating layer IL5 may be disposed on the second insulating structure IS2 and cover the second insulating structure IS2, but not limited thereto. In other words, the second insulating structure IS2 (or the insulating portion IP) may be disposed between the insulating layer IL5 and the first insulating structure IS1. The insulating layer IL5 may include any suitable inorganic material, but not limited thereto. In addition, in the present embodiment, the portion of the insulating layer IL1 and the portion of the insulating layer IL2 corresponding to the groove(s) GR and the second insulating structure IS2 may be removed, and the insulating layer IL3 may be filled into the groove(s) GR and disposed on the second insulating structure IS2, but not limited thereto. Specifically, the insulating layer IL3 may cover the insulating layer IL5, and the insulating layer IL5 may be located between the second insulating structure IS2 and the insulating layer IL3. In other words, the insulating layer IL5 may separate the second insulating structure IS2 and the insulating layer IL3. In the present embodiment, the second insulating structure IS2 and the insulating layer IL3 may include organic materials, wherein the material of the second insulating structure IS2 and the material of the insulating layer IL3 may be the same or different. It should be noted that although FIG. 5B shows the structure that an insulating layer IL5 is disposed on the second insulating structure IS2, the present disclosure is not limited thereto. In some embodiments, the electronic device 400 may include two or more insulating layers disposed on the second insulating structure IS2 and covering the second insulating structure IS2.

According to the present embodiment, as shown in FIG. 5A, the second insulating structure IS2 (or the insulating portion IP) may be patterned to include a ring-shaped structure in the top view direction of the electronic device 400, and the second insulating structure IS2 may surround the electronic elements EL, but not limited thereto. That is, the electronic elements EL may be located in the region enclosed by the ring-shaped structure of the second insulating structure IS2 in the top view direction of the electronic device 400. It should be noted that although it is not shown in FIG. 5A, the second insulating structure IS2 may surround the active elements (such as the transistor TS) of the electronic device 400 in the top view direction of the electronic device 400, but not limited thereto. In addition, the second insulating structure IS2 may be disposed between the electronic elements EL and the grooves GR of the first insulating structure IS1 in the top view direction of the electronic device 400, that is, the grooves GR may be farther away from the electronic elements EL than the second insulating structure IS2, but not limited thereto. It should be noted that the structure and arrangement of the grooves of the present embodiment are not limited to what is shown in FIG. 5A and may refer to the structures and arrangements in the above-mentioned embodiments. According to the present embodiment, since the electronic device 400 may include the second insulating structure IS2, wherein the second insulating structure IS2 may surround the electronic elements EL in the top view direction of the electronic device 400, the possibility that the organic material of the organic layer (such as the insulating layer IL3, but not limited thereto) in the electronic device 400 overflows to the outside of the electronic device 400 and creates a conducting path for moisture and/or oxygen may be reduced by the second insulating structure IS2, thereby reducing abnormal conditions of the electronic elements EL and/or the active elements of the electronic device 400 due to being affected by moisture and/or oxygen. Specifically, the second insulating structure IS2 with the ring-shaped structure may for example serve as a dam to reduce the possibility of overflow of the organic material of the organic layer. The feature that the electronic device 400 includes the second insulating structure IS2 in the present embodiment may be applied to each of the embodiments of the present disclosure.

As shown in FIG. 5A and FIG. 5B, the main structure MP of the electronic device 400 may have an edge ED, wherein the edge ED of the main structure MP may be out of the second insulating structure IS2. "The edge ED is out of the second insulating structure IS2" described herein may represent that the edge ED may be farther away from the electronic elements EL than the second insulating structure IS2, but not limited thereto. Therefore, a distance D1 may be included between the edge ED and the second insulating structure IS2 (or the insulating portion IP), wherein the distance D1 may be greater than 0. The distance D1 may for example be the minimum distance between the outer edge of the insulating portion IP and the edge ED in the direction (such as the direction X) parallel to the surface (such as the plane X-Y) of the substrate SB, but not limited thereto. The outer edge of the insulating portion IP mentioned above may be the outermost of the insulating portion IP in the top view of the electronic device 400 or the outermost of the bottom of the insulating portion IP in the cross-sectional view of the electronic device 400, but not limited thereto. According to the present embodiment, the distance D1 between the edge ED and the second insulating structure IS2 may be greater than or equal to 3.6 micrometers (μm) and less than or equal to 360 μm (that is, 3.6 μm≤D1≤360 μm), but not limited thereto. When the distance D1 is less than 3.6 μm, the second insulating structure IS2 may be too close to the edge ED of the main structure MP, such that the organic materials may be easily extend to the edge ED when it overflows and form a conducting path for moisture and/or oxygen, thereby affecting the functions of the electronic elements EL and/or the active elements. When the distance D1 is greater than 360 μm, the second insulating structure IS2 may be too far from the edge ED of the main structure MP, thereby reducing space for disposing the electronic elements EL and/or the active elements, or the function of the second insulating structure IS2 to block the overflow of organic materials may be weakened. Therefore, by making the distance D1 between the edge ED and the second insulating structure IS2 located within the above-mentioned range, the possibility that organic materials overflow to the outside of the electronic device 400 to form the conducting path of moisture and/or oxygen may be reduced while reducing the influence on the disposition space of the electronic elements EL and/or the active elements. It should be noted that although FIG. 5B shows the structure that the edge ED of the main structure MP may protrude from the first insulating structure IS1, it is just exemplary, and the present embodiment is not limited thereto.

As shown in FIG. 5B, the first insulating structure IS1 of the electronic device 400 of the present embodiment may include the multi-layer structure form by stacking the first insulating layer IS11, the second insulating layer IS12 and the third insulating layer IS13 in sequence, wherein the third insulating layer IS13 may be located on the first insulating layer IS11 and the second insulating layer IS12. According to the present embodiment, the portion of the third insulating layer IS13 adjacent to the edge (such as the edge ED) of the main structure MP may be removed, and a portion of the second insulating layer IS12 may be exposed, but not limited thereto. In other words, the area of the third insulating layer IS13 may be reduced toward the direction away from the edge ED of the main structure MP. By removing the portion of the third insulating layer IS13 adjacent to the edge ED of the main structure MP, the possibility of cracks at the edge of the first insulating structure IS1 due to stress may be reduced, thereby reducing the condition that the cracks extend from the edge of the first insulating structure IS1 to the electronic elements EL and/or the active elements. It should be noted that the structure of the first insulating structure IS1 of the present embodiment is not limited to what is shown in FIG. 5B. In some embodiments, the portion(s) of the first insulating layer IS11 and/or the second insulating layer IS12 adjacent to the edge ED of the main structure MP may be removed.

As shown in FIG. 5B, the first insulating structure IS1 of the present embodiment may include an end portion EP, wherein the end portion EP may be adjacent to the edge ED of the main structure MP. The end portion EP may be defined through the groove(s) GR. Specifically, the groove (s) GR of the first insulating structure IS1 of the present embodiment may be formed by removing a portion of the third insulating layer IS13, and the groove (s) GR may divide the third insulating layer IS13 into at least two portions, wherein the end portion EP of the first insulating structure IS1 may be defined as the portion of the third insulating layer IS13 adjacent to the edge ED of the main structure MP, but not limited thereto. In some embodiments, the groove(s) GR may be formed by removing a portion of the second insulating layer IS12 and a portion of the third insulating layer IS13, and the end portion EP may include the portion of the second insulating layer IS12 and the portion of the third insulating layer IS13 adjacent to the edge ED of the main structure MP. According to the present embodiment, since the portion of the third insulating layer IL3 adjacent to the edge ED of the main structure MP may be removed, the edge ED of the main structure MP may be out of the end portion EP of the first insulating structure IS1, and a distance D2 may be included between the end portion EP and the edge ED of the main structure MP, wherein the distance D2 may be greater than 0. "The edge ED is out of the end portion EP" described herein may represent that the edge ED may be farther away from the electronic elements EL than the end portion EP, but not limited thereto. In addition, the distance D2 may represent the reduced length of the third insulating layer IS13 toward the direction away from the edge ED, but not limited thereto. The distance D2 may for example be defined as the minimum distance between the outer edge of the end portion EP and the edge ED in the direction (such as the direction X) parallel to the surface (such as the plane X-Y) of the substrate SB, but not limited thereto. "The outer edge of the end portion EP" mentioned above may be the outermost of the end portion EP in the top view of the electronic device 400 or the outermost of the bottom of the end portion EP in the cross-sectional view of the electronic device 400, but not limited thereto. According to the present embodiment, the distance D2 between the end portion EP and the edge ED may be greater than 0 and less than or equal to 180 μm (that is, $0<D2\leq 180$ μm), but not limited thereto. When the distance D2 is 0, the end portion EP may be aligned with the edge ED of the main structure MP, and the possibility of cracks in the end portion EP may be increased. When the distance D2 is greater than 180 μm, the end portion EP may be too far from the edge ED of the main structure MP, thereby reducing space for disposing the electronic elements EL and/or the active elements, or the electronic elements EL and/or the active elements may be broken or the structures of the electronic elements EL and/or the active elements may be unstable when forming the grooves GR. Therefore, by making the distance D2 between the end portion EP and the edge ED within the above-mentioned range, the possibility of cracks at the edge of the first insulating structure IS1 may be reduced while reducing influence on the electronic elements EL and/or the active elements.

In addition, the substrate SB of the present embodiment may include a multi-layer structure, but not limited thereto. For example, as shown in FIG. 5B, the substrate SB may include a first layer LR1, a second layer LR2 and a third layer LR3, wherein the second layer LR2 may be disposed between the first layer LR1 and the third layer LR3. When the substrate SB is patterned to form the main structures MP and the connecting structures CP, the first layer LR1, the second layer LR2 and the third layer LR3 may all be patterned, but not limited thereto. The first layer LR1 and the third layer LR3 may for example include polyimide, and the second layer LR2 may include any suitable oxide, but not limited thereto. By making the substrate SB include oxides, the possibility of moisture and/or oxygen entering the electronic device 400 from the side of the substrate SB may be reduced, thereby reducing abnormal conditions of the electronic elements EL and/or the active elements due to being affected by moisture and/or oxygen. The feature that the substrate SB includes the multi-layer structure in the present embodiment may be applied to each of the embodiments of the present disclosure.

Figure 6:
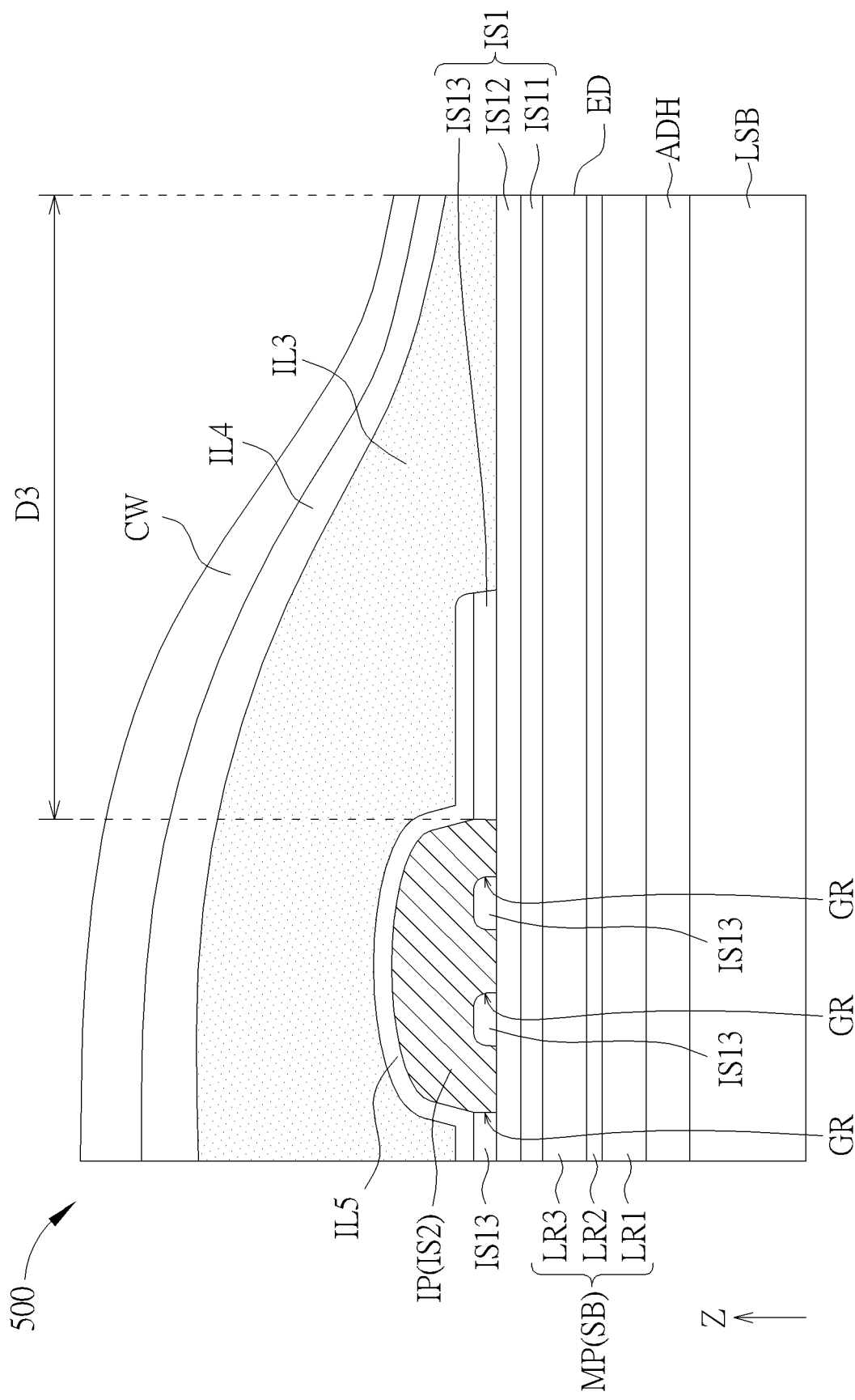
FIG. 6 schematically illustrates a partial enlarged top view of an electronic device according to a fifth embodiment of the present disclosure.

Referring to FIG. 6, FIG. 6 schematically illustrates a partial enlarged top view of an electronic device according to a fifth embodiment of the present disclosure. Specifically, FIG. 6 shows the cross-sectional structure of the portion of the electronic device 500 at the edge of the main structure MP. One of the main differences between the electronic device 500 of the present embodiment and the electronic device 400 shown in FIG. 5A and FIG. 5B is the design of the second insulating structure IS2. According to the present embodiment, as shown in FIG. 6, the electronic device 500 may include the second insulating structure IS2 disposed on the first insulating structure IS1, and the second insulating structure IS2 may have the insulating portion IP, wherein the insulating portion IP may overlap the grooves GR of the first insulating structure IS1 in the top view direction of the electronic device 500. It should be noted that "the insulating portion IP overlaps the grooves GR of the first insulating structure IS1 in the top view direction of the electronic device 500" describe herein may include the embodiment that the insulating portion IP overlaps or at least partially overlaps at least one groove GR. Since the insulating portion IP may overlap the grooves GR in the top view direction of the electronic device 500, a portion of the insulating portion IP may be filled in the grooves GR, or a portion of the insulating portion IP may be disposed in the grooves GR, but not limited thereto. According to the present embodiment, by making the insulating portion IP of the second insulating structure IS2 overlap the grooves GR in the top view direction of the electronic device 500, the space requirement of the grooves GR and the second insulating structure IS2 may be reduced, thereby improving spatial configuration of other elements (such as the electronic elements EL) of the electronic device 500. The features of other elements and/or layers of the electronic device 500 shown in FIG. 6 may refer to the contents in the above-mentioned embodiments, and will not be redundantly described.

In addition, in the present embodiment, the edge ED of the main structure MP may be out of the groove GR of the first insulating structure IS1, and a distance D3 may be included between the groove GR of the first insulating structure IS1 and the edge ED of the main structure MP. "The edge ED is out of the groove GR" may represent that the edge ED may be farther away from the electronic elements EL than the groove GR, but not limited thereto. The distance D3 may for example be defined as the minimum distance between the outer edge of the groove GR and the edge ED in the direction (such as the direction X) parallel to the surface (such as the plane X-Y) of the substrate SB, but not limited thereto. The outer edge of the groove GR mentioned above may be the outermost of the groove GR in the top view of the electronic device 500 or the outermost of the bottom of the groove GR in the cross-sectional view of the electronic device 500, but not limited thereto. It should be noted that when the first insulating structure IS1 includes multiple grooves GR, the distance D3 may be defined as the minimum distance between the outer edge of the groove GR adjacent to the edge ED of the main structure MP and the edge ED in the direction (such as the direction X) parallel to the surface (such as the plane X-Y) of the substrate SB, but not limited thereto. According to the present embodiment, the distance D3 may be greater than or equal to 1.2 µm and less than or equal to 180 µm (that is, 1.2 µm≤D3≤180 µm), but not limited thereto. When the distance D3 is less than 1.2 µm, the grooves GR may be too close to the edge ED of the main structure MP, such that the effect of blocking moisture and/or oxygen may be reduced. When the distance D3 is greater than 180 µm, the grooves GR may be too far from the edge ED of the main structure MP, thereby reducing space for disposing the electronic elements EL and/or the active elements, or the electronic elements EL and/or the active elements may be broken or the structures of the electronic elements EL and/or the active elements may be unstable when forming the grooves GR. Therefore, by making the distance D3 between the grooves GR and the edge ED within the above-mentioned range, the possibility of moisture and/or oxygen entering the electronic device 500 may be reduced through the grooves GR while reducing the influence on the electronic elements EL and/or the active elements. The range of the distance D3 between the groove GR and the edge ED of the main structure MP in the present embodiment may be applied to each of the embodiments of the present disclosure.

Figure 7:
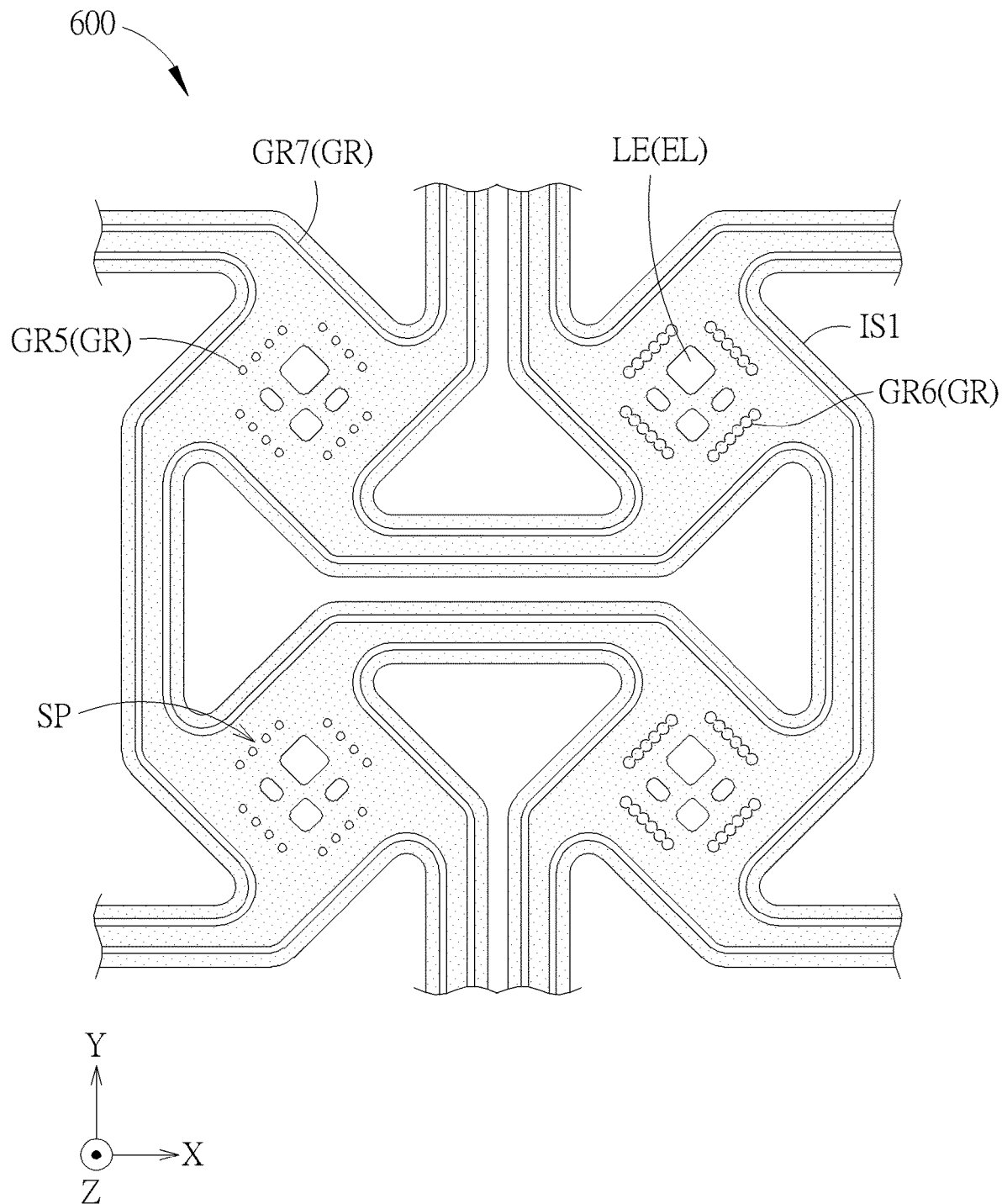
FIG. 7 schematically illustrates a partial enlarged top view of an electronic device according to a sixth embodiment of the present disclosure.

Referring to FIG. 7, FIG. 7 schematically illustrates a partial enlarged top view of an electronic device according to a sixth embodiment of the present disclosure. Specifically, FIG. 7 shows some examples of the grooves GR of the first insulating structure IS1 of the electronic device 600. According to the present embodiment, the first insulating structure IS1 may have multiple grooves GR, wherein the grooves GR may be formed by removing a portion of the first insulating structure IS1 through any suitable way. In other words, the grooves GR may have any suitable shape. In some embodiments, the first insulating structure IS1 may have the grooves GR5, wherein the grooves GR5 may have a circular structure in the top view direction of the electronic device 600, and the grooves GR5 may be arranged to surround the electronic elements EL. The spacing SP may be defined between two adjacent grooves GR5. In some embodiments, the first insulating structure IS1 may have the grooves GR6, wherein the grooves GR6 may include the shape formed by connecting multiple circles in the top view direction of the electronic device 600, and the grooves GR6 may be arranged to surround the electronic elements EL. In some embodiments, as shown in FIG. 7, the pattern of the first insulating structure IS1 and the pattern of the substrate (not shown) may be the same, and the first insulating structure IS1 may be disposed on the main structures and the connecting structures (not shown) of the substrate, wherein the first insulating structure IS1 may have the grooves GR7, and the grooves GR7 may be disposed along the edges of the first insulating structure IS1. In such condition, the grooves GR7 may be disposed on the main structures and the connecting structures of the substrate. The structures of the grooves GR mentioned in the present embodiment may be applied to each of the embodiments of the present disclosure. It should be noted that the structures of the grooves GR shown in FIG. 7 is exemplary, and the present disclosure is not limited thereto.

In summary, an electronic device is provided by the present disclosure, wherein the electronic device includes the substrate and the first insulating structure disposed on the substrate. Since the first insulating structure may have at least one groove, the possibility that the cracks extend from the edge of the substrate toward the inside of the electronic device may be reduced. Therefore, the influence of moisture and/or oxygen on the electronic elements and/or the active elements may be reduced, thereby improving performance or lifespan of the electronic device. In addition, the electronic device may further include the second insulating structure disposed on the first insulating structure, wherein the second insulating structure may reduce the possibility that the organic material of the organic layer in the electronic device overflows to the outside of the electronic device and creates a conducting path for moisture and/or oxygen may be reduced, thereby reducing abnormal conditions of the electronic elements and/or the active elements of the electronic device due to being affected by moisture and/or oxygen.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a first main structure;
a second main structure adjacent to the first main structure;
a connecting structure connecting the first main structure and the second main structure;
a circuit layer disposed on the first main structure and having a first semiconductor;
an electronic element disposed on the circuit layer and electrically connected to the first semiconductor; and
a first insulating structure sandwiched between the first semiconductor and the first main structure and having a first groove, wherein the first groove exposes at least a portion of a surface of the first main structure.

2. The electronic device of claim 1, wherein the first insulating structure has a first end portion closer to an edge of the first main structure, the edge is out of the first end portion, a distance is between the first end portion and the edge of the first main structure, and the distance is greater than 0.

3. The electronic device of claim 2, wherein the distance is less than or equal to 180 μm.

4. The electronic device of claim 1, wherein an edge of the first main structure is out of the first groove, a distance is between the first groove and the edge, and the distance is greater than or equal to 1.2 μm and less than or equal to 180 μm.

5. The electronic device of claim 1, further comprising a conductive wire disposed on the first insulating structure, extending from the first main structure to the connecting structure and crossing the first groove.

6. The electronic device of claim 1, wherein the first insulating structure has a second groove on the first main structure, and the first groove and the second groove are separated by a spacing.

7. The electronic device of claim 6, wherein the first groove and the second groove are different in depth.

8. The electronic device of claim 6, further comprising a conductive wire disposed on the first insulating structure, extending from the first main structure to the connecting structure and passing through the spacing.

9. The electronic device of claim 1, further comprising a second insulating structure disposed on the first insulating structure and having an insulating portion, wherein the insulating portion is overlapped with the first groove.

10. The electronic device of claim 9, wherein a part of the insulating portion is disposed in the first groove.

11. The electronic device of claim 1, further comprising a second insulating structure disposed on the first insulating structure and having an insulating portion, wherein an edge of the first main structure is out of the second insulating structure and a distance is between the insulating portion and the edge, and the distance is greater than 0.

12. The electronic device of claim 11, wherein the distance is greater than or equal to 3.6 μm and less than or equal to 360 μm.

13. The electronic device of claim 1, further comprising a second semiconductor disposed on the second main structure, wherein the first insulating structure is further sandwiched between the second semiconductor and the second main structure.

* * * * *